United States Patent
Lin et al.

(10) Patent No.: US 8,392,132 B2
(45) Date of Patent: Mar. 5, 2013

(54) PROCESS VARIATION DETECTION APPARATUS AND PROCESS VARIATION DETECTION METHOD

(75) Inventors: Ku-Feng Lin, Taipei County (TW); Meng-Fan Chang, Taichung (TW); Shyh-Shyuan Sheu, Hsinchu County (TW); Pei-Chia Chiang, Taipei (TW); Wen-Pin Lin, Changhua County (TW); Chih-He Lin, Yunlin County (TW)

(73) Assignee: Industrial Technology Research Institute, Hsinchu (TW)

( * ) Notice: Subject to any disclaimer, the term of this patent is extended or adjusted under 35 U.S.C. 154(b) by 282 days.

(21) Appl. No.: 12/851,547

(22) Filed: Aug. 5, 2010

(65) Prior Publication Data

US 2011/0270555 A1 Nov. 3, 2011

(30) Foreign Application Priority Data

Apr. 29, 2010 (TW) .............................. 99113704 A

(51) Int. Cl.
*G06F 19/00* (2011.01)
(52) U.S. Cl. ........................................................ 702/64
(58) Field of Classification Search ..................... 702/64
See application file for complete search history.

(56) References Cited

U.S. PATENT DOCUMENTS

| 5,068,547 | A | 11/1991 | Gascoyne |
| 5,486,786 | A | 1/1996 | Lee |
| 5,903,012 | A | 5/1999 | Boerstler |

OTHER PUBLICATIONS

Rong Yang, Simulation and comparison of MOS inversion layer quantum mechanics effects in SiGe PMOSFET and Si PMOSFET, Microelectronics Journal 35 (2004) 145-149.*

* cited by examiner

*Primary Examiner* — Tung S Lau
(74) *Attorney, Agent, or Firm* — Jianq Chyun IP Office

(57) ABSTRACT

A process variation detection apparatus and a process variation detection method are provided. The process variation detection apparatus includes a process variation detector and a compensation signal generator. The process variation detector includes a first process variation detection component, a second process variation detection component and a current comparator. The channel of the first process variation detection component is a first conductive type, and the channel of the second process variation detection component is a second conductive type, wherein the above-mentioned first conductive type is different from the second conductive type. The current comparator is connected to the first process variation detection component and the second process variation detection component for comparing the current difference between the two components and outputting a current comparison result. The compensation signal generator is connected to the process variation detector, and produces a corresponding compensation signal according to the current comparison result.

11 Claims, 3 Drawing Sheets

PROCESS VARIATION DETECTION APPARATUS AND PROCESS VARIATION DETECTION METHOD

CROSS-REFERENCE TO RELATED APPLICATION

This application claims the priority benefit of Taiwan application serial no. 99113704, filed on Apr. 29, 2010. The entirety of the above-mentioned patent application is hereby incorporated by reference herein and made a part of this specification.

TECHNICAL FIELD

The disclosure relates to an integrated circuit (IC), and more particularly, to a process variation detection apparatus and a process variation detection method.

BACKGROUND

Along with the progress of electronic science and technology, the operation voltage level of an electronic component gets lower and lower, and a reduced operation voltage level means the tolerance of an electronic component on the process variation is more low. For example, for a resistance random access memory (RRAM) device, a phase change memory (PCM) or other new-age non-volatile memories (NVM), the operation voltage level (or bias voltage level) thereof is quite low. As these memory devices perform a reading operation, in order to avoid read disturbance, the memory devices must be operated at a low bias voltage during a reading so as to ensure the storage data not to be destroyed.

However, in a semiconductor process, it is often to have process variation. Due to the inconsistency of the thicknesses of the oxide layers or the ion-doped concentrations, the transistor driving current is thereby often not the same as the design value, which is specially in an advanced process more serious. When the process variation occurs, an error of the transistor driving current makes the bias voltage level of the NVM devices drifted, which leads to a reduced production yield or degrade the efficiency. Therefore, a mechanism of detecting the process variation and compensating is required so as to increase the stability of read bias voltage.

SUMMARY

Accordingly, a process variation detection apparatus and a process variation detection method applicable to a non-volatile memory (NVM) are introduced herein, which is able to detect process variation and produce a corresponding compensation signal to other circuits (for example, a compensation circuit). The compensation circuit then can correspondingly adjust the operation voltage level (or bias voltage level) of the electronic components according to the compensation signal.

An embodiment of the disclosure provides a process variation detection apparatus applicable to a NVM, and the apparatus includes a process variation detector and a compensation signal generator. The process variation detector includes a first process variation detection component, a second process variation detection component and a current comparator. The channel of the first process variation detection component is a first conductive type, and the channel of the second process variation detection component is a second conductive type, wherein the above-mentioned first conductive type is different from the second conductive type. The current comparator is connected to the first process variation detection component and the second process variation detection component for comparing the current difference between the two components and outputting a current comparison result. The compensation signal generator is connected to the process variation detector, and produces a corresponding compensation signal according to the current comparison result.

An embodiment of the disclosure provides a process variation detection method applicable to a NVM, which includes: providing a first process variation detection component and a second process variation detection component, wherein the channel of the first process variation detection component is a first conductive type and the channel of the second process variation detection component is a second conductive type, and the above-mentioned first conductive type is different from the second conductive type; comparing the current difference between the first process variation detection component and the second process variation detection component so as to obtain a current comparison result; and producing a corresponding compensation signal according to the current comparison result.

Based on the depiction above, the embodiment of the present disclosure detects the relative process variation between the two detection components by comparing the current difference between the two process variation detection components which respectively have different conductive types and produces the corresponding compensation signal according to the current comparison result. The IC can adjust the voltage level according to the compensation signal. Taking a bit-line voltage damper of a NVM as an example, the compensation signal can be used to adjust the virtual power voltage level of the bit-line voltage damper and to realize the compensation control of the bit-line bias voltage level.

Several exemplary embodiments accompanied with figures are described in detail below to further describe the disclosure in details.

BRIEF DESCRIPTION OF THE DRAWINGS

The accompanying drawings are included to provide a further understanding, and are incorporated in and constitute a part of this specification. The drawings illustrate exemplary embodiments and, together with the description, serve to explain the principles of the disclosure.

DETAILED DESCRIPTION OF DISCLOSED EMBODIMENTS

Figure 1:
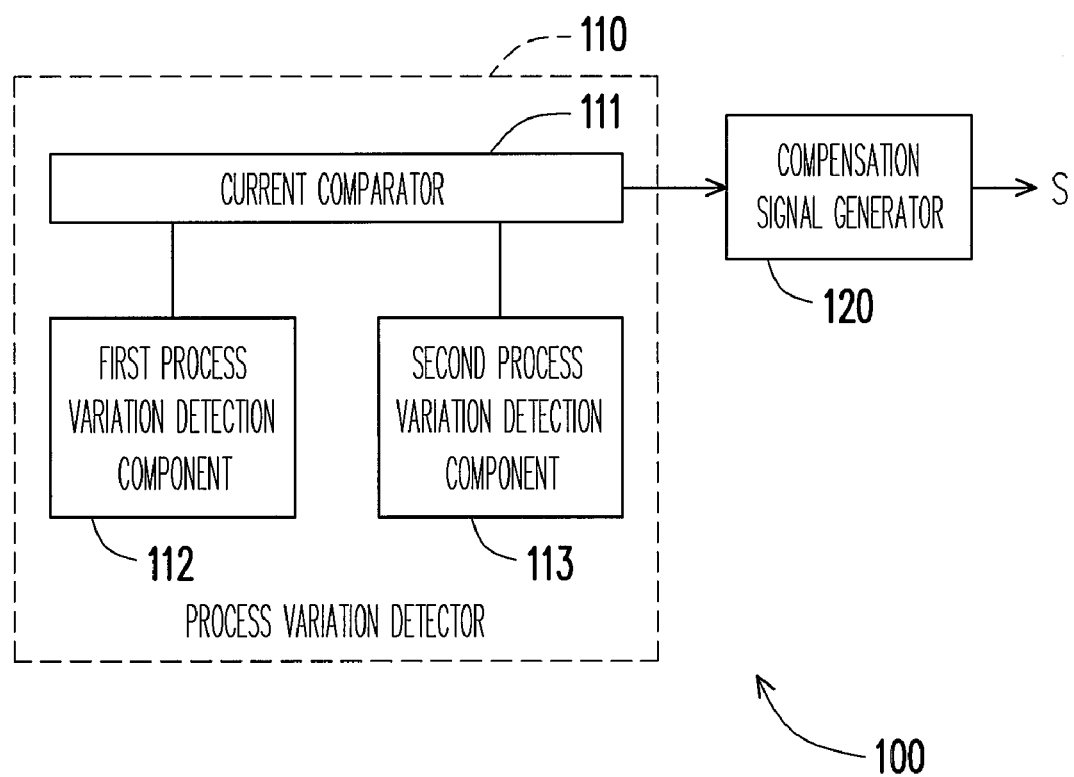
FIG. 1 is a scheduled diagram illustrating the function blocks of a process variation detection apparatus according to an exemplary embodiment.

FIG. 1 is a scheduled diagram illustrating the function blocks of a process variation detection apparatus 100 according to an exemplary embodiment of the disclosure. The process variation detection apparatus 100 applicable to a non-volatile memory (NVM) includes a process variation detector 110 and a compensation signal generator 120. The process variation detector 110 includes a current comparator 111, a first process variation detection component 112 and a second process variation detection component 113. The first process variation detection component 112 and the second process variation detection component 113 are two process variation detection components with different conductive types. For example, the first process variation detection component 112 can be a P-type doped device and the second process variation detection component 113 can be an N-type doped device.

The current comparator 111 is connected to the first process variation detection component 112 and the second process variation detection component 113. The embodiment uses the current comparator 111 to compare the current difference between the first process variation detection component 112 and the second process variation detection component 113 so as to detect the relative process variation, followed by outputting the current comparison result to the compensation signal generator 120. The above-mentioned current comparison result can be any physical amount. For example, the current comparator 111 can output an analog voltage to represent the current comparison result between the component 112 and the component 113.

The compensation signal generator 120 is connected to the process variation detector 110. The compensation signal generator 120 produces a corresponding compensation signal S to other circuits according to the current comparison result provided by the current comparator 111. The compensation signal S can be an analog signal or a digital signal depending on the design requirement of the next stage compensation circuit. The compensation signal generator 120 can be implemented in any method. For example, in the compensation signal generator 120, an analog-to-digital converter (ADC) is disposed so as to convert the current comparison result output from the current comparator 111 into a compensation signal S in digital codes. For example, a plurality of voltage comparators can be also disposed in the compensation signal generator 120, and each voltage comparator respectively has a different voltage comparison range, and the voltage comparators convert the current comparison result output from the process variation detector 110 into a compensation signal S in multi-bits digital codes.

Figure 2:
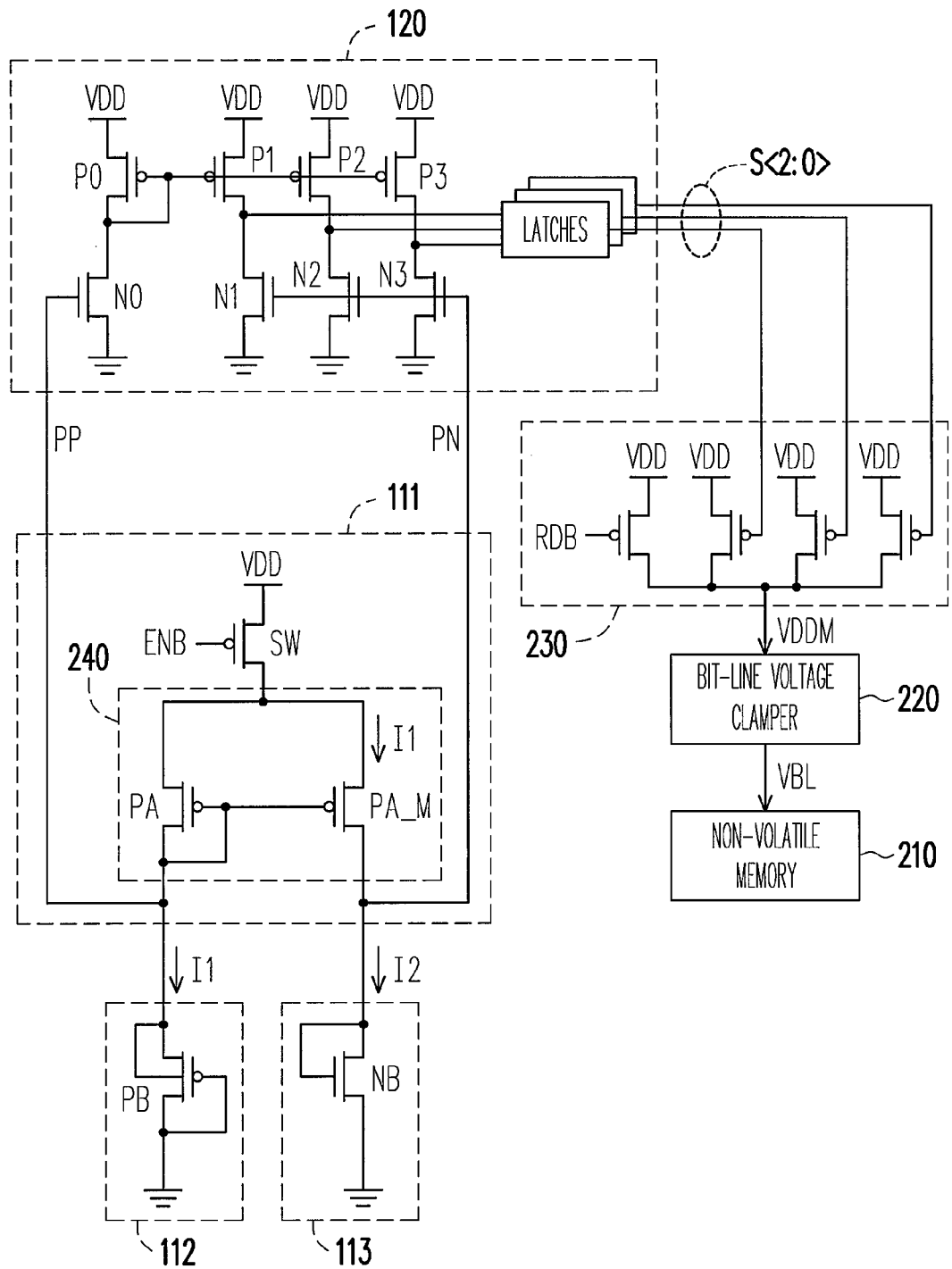
FIG. 2 is a diagram of an exemplary embodiment of the process variation detection apparatus of FIG. 1.

FIG. 2 is a diagram of an exemplary embodiment of the process variation detection apparatus 100 of FIG. 1. The embodiment makes the process variation detection apparatus 100 used in a NVM 210 and the bit-line voltage clamper 220 and the compensation circuit 230 thereof. The NVM 210 can be a resistance random access memory (RRAM), a phase change memory (PCM) or other NVMs. The embodiment of FIG. 2 is based on, for example, a process of complementary metal-oxide semiconductor field effect transistor (briefed as CMOS FET), which the process variation detection apparatus 100 of the present disclosure is not limited to.

The operation voltage level (or bias voltage level) of the NVM 210 is very low. As the memory devices perform reading operations, the bit-line voltage damper 220 provides a very low bias voltage level to the bit-line of the NVM 210 to ensure the storage data not destroyed. As performing a current sensing reading, no matter the storage date of a memory cell is 1 or 0, the bit-line voltage damper 220 always provides a fixed bias voltage to make the memory cell produce different corresponding currents. Therefore, the bit-line reading bias voltage VBL provided by the bit-line voltage clamper 220 must be quite accurate. An over-high reading bias voltage would cause a risk of read disturbance. Contrarily, a too low reading bias voltage would reduce the reading current so as to slow down the reading speed. However, in the semiconductor process, the process variation is present very often, which leads the reading current is different from the design value and it is a more serious case in the advanced process.

Referring to FIG. 2, the first process variation detection component 112 includes a P-channel metal oxide semiconductor (PMOS) transistor PB and the second process variation detection component 113 includes an N-channel metal oxide semiconductor (NMOS) transistor NB. The transistor PB can be composed of a single PMOS transistor or a plurality of PMOS transistors in parallel connection, and the transistor NB can be composed of a single NMOS transistor or a plurality of NMOS transistors in parallel connection. In the embodiment, the design parameter (for example, appearance ratio or channel aspect ratio) of the PMOS transistor is different from the design parameter of the NMOS transistor, wherein the proportion of the PMOS over the NMOS is determined by the TT position (i.e. TT corner) process parameter so as to make the driving currents thereof the same. In some applications however, the design parameters of the transistor PB and the transistor NB can be the same as each other. The first terminal of the PMOS transistor PB (for example, source) is connected to the first comparison terminal of the current comparator 111. The second terminal (for example, drain) and the control terminal (for example, gate) of the PMOS transistor PB are connected to a reference voltage (for example, the ground voltage). The body of the PMOS transistor PB is connected to the source of the PMOS transistor PB. The first terminal (for example, drain) and the control terminal (for example, gate) of the NMOS transistor NB are connected to the second comparison terminal of the current comparator 111. The second terminal (for example, source) of the NMOS transistor NB is connected to the ground voltage. In this way, the current comparator 111 can detect the CMOS process variation by comparing the current difference between the PMOS transistor PB and the NMOS transistor NB.

In the embodiment, the current comparator 111 includes a current mirror 240 and a third transistor SW, wherein the primary current terminal of the current mirror 240 is connected to the PMOS transistor PB and the slaved current terminal of the current mirror 240 is connected to the NMOS transistor NB. The current mirror 240 includes a first transistor PA and a second transistor PA_M. The first terminals (for example, sources) of the first transistor PA and the second transistor PA_M are coupled to a first voltage (for example, power voltage VDD) through the third transistor SW. The control terminals (for example, gates) of the first transistor PA and the second transistor PA_M are connected to the second terminal (for example, drain) of the first transistor PA. The drains of the first transistor PA and the second transistor PA_M respectively serve as the primary current terminal and the slaved current terminal of the current mirror 240, wherein the voltages of the primary current terminal and the slaved current terminal of the current mirror 240 serve as the current comparison result of the current comparator 111 and the current comparison result is provided to the compensation signal generator 120.

The compensation signal generator 120 includes a fourth transistor P0, a fifth transistor N0, a sixth transistor P1 and a seventh transistor N1. The first terminal (for example, source) of the fourth transistor P0 is coupled to the power voltage VDD. The control terminal (for example, gate) of the fourth transistor P0 is connected to the second terminal (for example, drain) of the fourth transistor P0. The first terminal (for example, drain) of the fifth transistor N0 is coupled to the drain of the fourth transistor P0. The second terminal (for example, source) of the fifth transistor N0 is connected to the ground voltage. The control terminal (for example, gate) of the fifth transistor N0 is connected to the primary current terminal of the current mirror 240. The first terminal (for example, source) of the sixth transistor P1 is coupled to the power voltage VDD. The control terminal (for example, gate) of the sixth transistor P1 is connected to the gate of the fourth transistor P0. The second terminal (for example, drain) of the sixth transistor P1 provides one of the bits of the compensation signal S. The first terminal (for example, drain) of the seventh transistor N1 is coupled to the drain of the sixth transistor P1. The second terminal (for example, source) of the seventh transistor N1 is connected to the ground voltage. The control terminal (for example, gate) of the seventh transistor N1 is connected to the slaved current terminal of the current mirror 240.

Anyone taking the embodiment for application can increase or decrease the number of the transistor strings according to the bit number of the compensation signal S. Taking FIG. 2 as an example, the compensation signal S has three bits. Therefore, in addition to the transistor string composed of the sixth transistor P1 and the seventh transistor N1, the compensation signal generator 120 further has a second transistor string (i.e., the transistors P2 and N2) and a third transistor string (i.e., the transistors P3 and N3). By means of different appearance ratio (or channel aspect ratio) of the transistors N1, N2 and N3, the above-mentioned three transistor strings are equivalent to three voltage comparators, wherein the three voltage comparators respectively have different voltage comparison ranges. The appearance ratio of the transistors N1, N2 and N3 depends on the design requirement. In the embodiment, the appearance ratio (or channel aspect ratio) of the transistors N1, N2 and N3 is 0.85:1:1.15.

Figure 3:
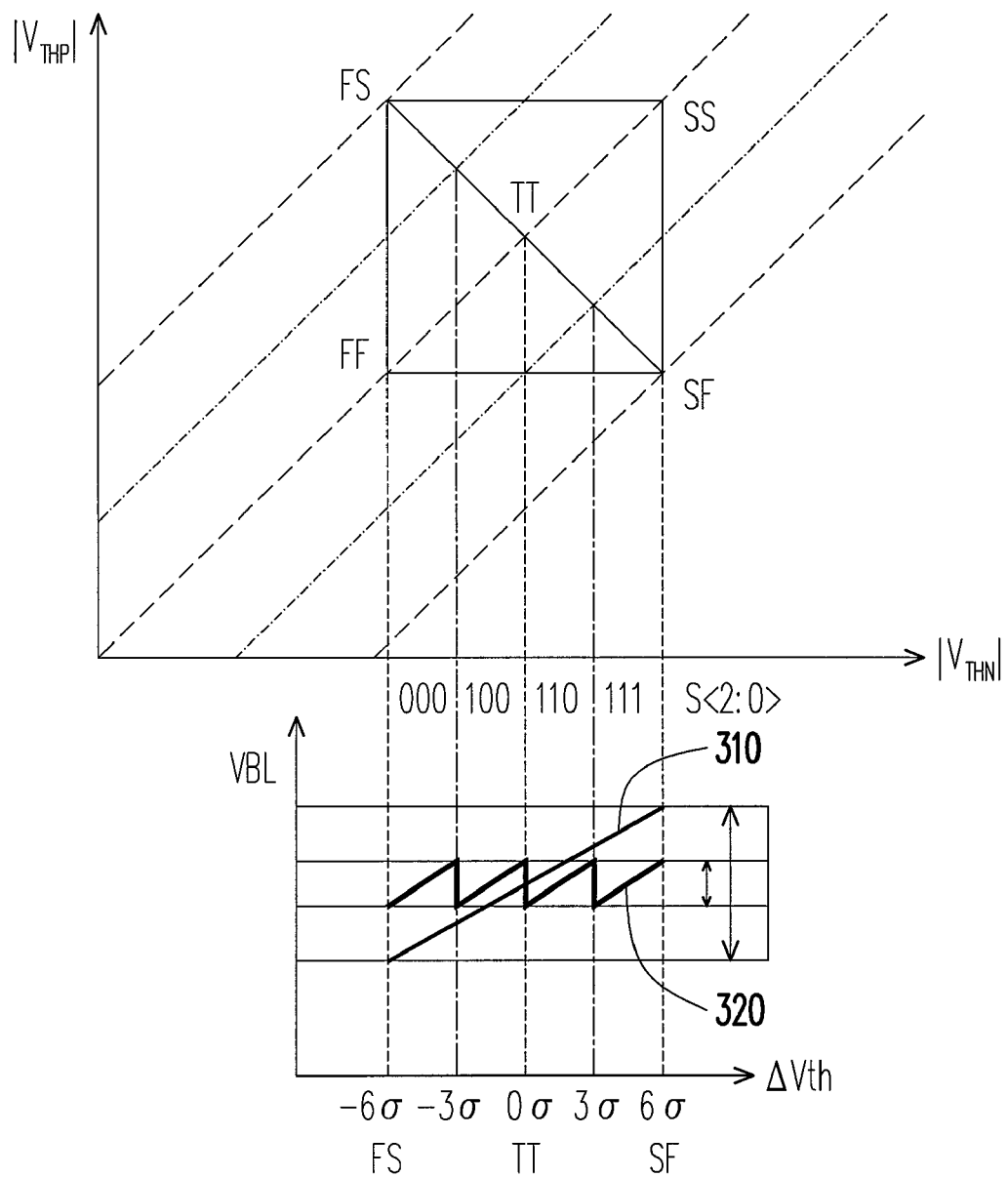
FIG. 3 is a diagram illustrating the application effect of the compensation mechanism of the circuit of FIG. 2.

According to the depiction above, the current mirror 240 mirrors the current I1 flowing through the PMOS transistor PB onto the second transistor PA_M, so as to compare the current I1 with the current I2 of the NMOS transistor NB. FIG. 3 is a diagram illustrating the application effect of the compensation mechanism of the circuit of FIG. 2. The ordinate of the upper portion of FIG. 3 represents the PMOS transistor threshold voltage $|V_{THP}|$, the abscissa represents the NMOS transistor threshold voltage $|V_{THN}|$. The dimension ratio of the transistor PB over the transistor NB is determined by the parameter such as the threshold voltage of PMOS and NMOS in the TT position (i.e. TT corner) or the electron (hole) mobility rate. When a process falls into the TT position condition, the driving capabilities of the transistor PB and the transistor NB are the same and the voltage PP and the voltage PN are the same as each other; when a process falls into the FF corner condition or the SS corner condition, the voltage PP is roughly equal to the voltage PN, wherein voltage PP is obtained from the dividing voltage of the transistor PA and the transistor PB so that the voltages PP in each corner are the same; when a process falls into the FS corner condition, the driving capability of NMOS is greater than the driving capability of PMOS, i.e. the current I2 of the transistor NB is greater than the current I1 of the transistor PB and, at the time, the voltage PN is less than the voltage PP. Contrarily, if a process falls into the SF corner condition, the voltage PN is greater than the voltage PP.

The ordinate of the lower portion of FIG. 3 represents the bit-line voltage VBL provided by the bit-line voltage damper 220, the abscissa represents the threshold voltage difference ΔVth between the PMOS transistor and the NMOS transistor. The characteristics curve 310 represents the case without compensation and the characteristics curve 320 represents the compensation result. The compensation signal generator 120 comprises a plurality of voltage comparators and a plurality of latches, the judgement range of input voltage difference for each voltage comparator is different. Since the voltage PP serves as the standard to judge the voltage difference, so that the voltage comparators share the positive terminals. The transistor P0 and the transistor N0 form the common positive terminal of the voltage comparators and the rest transistor strings (the transistors P1-P3 and the transistors N1-N3) form a plurality of negative terminals of the voltage comparators. As depiction above, the transistors N1-N3 are designed into different dimensions so as to distinguish different voltage differences. As a result, when the voltage difference between the positive terminal and the negative terminal is less than −75 mV, all the three bits S<2:0> of the compensation signal S output from the voltage comparators are 1; when the voltage difference between the positive terminal and the negative terminal ranges between −75 mV and 0 mV, the dimension of the transistor N3 is larger so that the three bits S<2:0> of the compensation signal S are 0, 1 and 1; when the voltage difference between the positive terminal and the negative terminal ranges between 0 mV and 75 mV, the three bits S<2:0> of the compensation signal S are 0, 0 and 1; when the voltage difference between the positive terminal and the negative terminal is greater than 75 mV, all the three bits S<2:0> of the compensation signal S are 0.

As shown by Table 1, when a process falls into the extreme FS corner condition, the threshold voltage is −6σ (the difference between the voltage PP and the voltage PN is larger and the voltage PN is lower), ΔV is roughly 150 mV so that the outputs of the voltage comparators are high voltage levels and the three bits of the compensation signal S output from the latches are 0. Contrarily, when a process falls into the extreme SF corner condition, the threshold voltage is 6σ (the voltage PN is higher than the voltage PP), ΔV is roughly −150 mV, the outputs of the voltage comparators are low voltage levels and all the three bits of the compensation signal S output from the latches are 1. The middle cases between the above-mentioned two extreme values have different output results according to the voltage ranges of the voltage comparators.

TABLE 1 output true values of the process variation detection circuit

| Process | S<2> | S<1> | S<0> |
|---|---|---|---|
| FS(ΔVth = −6σ) | 0 | 0 | 0 |
| FS(ΔVth = −2σ) | 1 | 0 | 0 |
| SF(ΔVth = 2σ) | 1 | 1 | 0 |
| SF(ΔVth = 6σ) | 1 | 1 | 1 |

* ΔVth = ΔV$_{THN}$ + ΔV$_{THP}$

The above-mentioned compensation signal S is latched by the latch and provided to the compensation circuit 230. When an enabling signal ENB is logic-0, the process variation detector 110 begins with detecting the process variation, and the detection result is transmitted to the compensation signal generator 120 to produce the compensation signal S in multi bits. The compensation circuit 230 adjusts the level of the virtual power voltage VDDM, so that the bias voltage level provided by the bit-line voltage damper (or adjuster) to NVM 210 can be compensated. When the enabling signal ENB is logic-1, the process variation detector 110 stops the operation to save power, and at the time, the latch keeps providing the compensation signal S to the compensation circuit 230.

The compensation signal S in FIG. 2 is output to the power switch (i.e., the compensation circuit 230) of the bit-line voltage clamper 220. Since there is a DC current present when the bit-line voltage clamper 220 is operated so that the virtual power voltage VDDM is lower than the power voltage VDD. If the compensation circuit 230 has four power switches, after starting the circuit, there is at least a power switch controlled with the voltage RDB and the power switch is turned on, while the rest switches would be turned on or off according to the compensation signal S <2:0>. The characteristics curve 310 in FIG. 3 is the affecting extent of the uncompensated bit-line bias voltage VBL on the process variation. Under the FS corner condition, NMOS is more strong, so that the bit-line bias voltage VBL is reduced and all the compensation signals S <2:0> of the FS corner in Table 1 are 0, which means the four power switches of the compensation circuit 230 in FIG. 2 are turned on, and the virtual power voltage VDDM is increased to advance the output level of the bit-line voltage damper 220 to close the originally designed bias voltage, as shown by the characteristics curve 320 in FIG. 3. Contrarily, under the SF corner condition, PMOS is more strong, so that the bit-line bias voltage VBL is drifted higher and all the compensation signals S <2:0> are 1, which means only one of the four power switches of the compensation circuit 230 in FIG. 2 is turned on, and the reduced virtual power voltage VDDM makes the output voltage level of the bit-line voltage clamper 220 reduced as well.

In summary, the above-mentioned embodiment discloses a process variation detection method, which includes following steps: providing a first process variation detection component 112 and a second process variation detection component 113; comparing the current difference between the first process variation detection component 112 and the second process variation detection component 113 to obtain a current comparison result; producing a corresponding compensation signal S according to the current comparison result.

In the above-mentioned embodiment of detecting the relative process variation the PMOS transistor PB and the NMOS transistor NB in a semiconductor process, a compensation signal is produced and provided to the other circuits for compensation so that the operation thereof does not cause a significant drift of the analog output voltage when the process variation is presented. The embodiment can be used in a memory circuit or other common CMOS FET ICs.

The embodiment can be used in a NVM. When NVM cells of many kinds are read, in order to avoid read disturbance, the bit-line bias voltage VBL is limited to a lower analog level. To ensure the product yield, the prior art would sacrifices some read currents so as to keep an enough bias voltage drift range. In some newer NVMs (for example, PCM or RRAM), the read bias voltage VBL is more low. In particular for the RRAM, whenever reducing the read bias voltage VBL, the read cell current is linearly reduced. The embodiment is able to keep the read cell current and meanwhile avoid the read disturbance.

In this way, no matter having a process variation, the read operation of the NVM is able to reduce the drifting problem of the bit-line bias voltage level according to the compensation signal.

It will be apparent to those skilled in the art that various modifications and variations can be made to the structure of the present invention without departing from the scope or spirit of the invention. In view of the foregoing, it is intended that the present invention covers modifications and variations of this invention provided they fall within the scope of the following claims and their equivalents.

What is claimed is:

1. A process variation detection apparatus applicable to a non-volatile memory, comprising:
   a process variation detector, comprising:
   a first process variation detection component, having a channel of a first conductive type;
   a second process variation detection component, having a channel of a second conductive type, wherein the above-mentioned first conductive type is different from the second conductive type; and
   a current comparator, connected to the first process variation detection component and the second process variation detection component for comparing the current difference between the two components and outputting a current comparison result; and
   a compensation signal generator, connected to the process variation detector and producing a corresponding compensation signal according to the current comparison result;
   wherein the first process variation detection component comprises a P-channel metal oxide semiconductor (PMOS) transistor and the second process variation detection component comprises an N-channel metal oxide semiconductor (NMOS) transistor.

2. The process variation detection apparatus applicable to a non-volatile memory as claimed in claim 1, wherein the PMOS transistor has a first terminal, a second terminal and a control terminal, wherein the first terminal of the PMOS transistor is connected to a first comparison terminal of the current comparator, the second terminal and the control terminal of the PMOS transistor are connected to a reference voltage; the NMOS transistor has a first terminal, a second terminal and a control terminal, wherein the first terminal and the control terminal of the NMOS transistor are connected to a second comparison terminal of the current comparator, and the second terminal of the NMOS transistor is connected to the reference voltage.

3. The process variation detection apparatus applicable to a non-volatile memory as claimed in claim 1, wherein the current comparator comprises a current mirror, the current mirror has a primary current terminal and a slaved current terminal, the primary current terminal of the current mirror is connected to the first process variation detection component, the slaved current terminal of the current mirror is connected to the second process variation detection component, and the voltages of the primary current terminal and the slaved current terminal serve as the current comparison result provided to the compensation signal generator.

4. The process variation detection apparatus applicable to a non-volatile memory as claimed in claim 1, wherein the compensation signal generator comprises a latch for latching the compensation signal.

5. The process variation detection apparatus applicable to a non-volatile memory as claimed in claim 2, wherein the body of the PMOS transistor is connected to the first terminal of the PMOS transistor.

6. The process variation detection apparatus applicable to a non-volatile memory as claimed in claim 3, wherein the current mirror comprises:
   a first transistor, having a first terminal, a second terminal and a control terminal, wherein the first terminal of the first transistor is coupled to a first voltage, the control terminal of the first transistor is connected to the second terminal of the first transistor, and the second terminal of the first transistor serves as the primary current terminal of the current mirror; and
   a second transistor, having a first terminal, a second terminal and a control terminal, wherein the first terminal of the second transistor is coupled to the first voltage, the control terminal of the second transistor is connected to the control terminal of the first transistor, and the second terminal of the second transistor serves as the slaved current terminal of the current mirror.

7. The process variation detection apparatus applicable to a non-volatile memory as claimed in claim 3, wherein the compensation signal generator comprises:
   a fourth transistor, having a first terminal, a second terminal and a control terminal, wherein the first terminal of the fourth transistor is coupled to a first voltage, and the control terminal of the fourth transistor is connected to the second terminal of the fourth transistor;

a fifth transistor, having a first terminal, a second terminal and a control terminal, wherein the first terminal of the fifth transistor is coupled to the second terminal of the fourth transistor, the second terminal of the fifth transistor is connected to a reference voltage, and the control terminal of the fifth transistor is connected to the primary current terminal of the current mirror;

a sixth transistor, having a first terminal, a second terminal and a control terminal, wherein the first terminal of the sixth transistor is coupled to the first voltage, the control terminal of the sixth transistor is connected to the control terminal of the fourth transistor, and the second terminal of the sixth transistor provides the compensation signal; and a seventh transistor, having a first terminal, a second terminal and a control terminal, wherein the first terminal of the seventh transistor is coupled to the second terminal of the sixth transistor, the second terminal of the seventh transistor is connected to the reference voltage, and the control terminal of the seventh transistor is connected to the slaved current terminal of the current mirror.

8. The process variation detection apparatus applicable to a non-volatile memory as claimed in claim 6, wherein the current comparator further comprises a third transistor, and the first terminals of the first transistor and the second transistor are coupled to the first voltage through the third transistor.

9. A process variation detection method applicable to a non-volatile memory, comprising:

providing a first process variation detection component and a second process variation detection component, wherein the channel of the first process variation detection component is a first conductive type and the channel of the second process variation detection component is a second conductive type, and the above-mentioned first conductive type is different from the second conductive type;

comparing the current difference between the first process variation detection component and the second process variation detection component so as to obtain a current comparison result; and producing a corresponding compensation signal according to the current comparison result;

wherein the first process variation detection component comprises a P-channel metal oxide semiconductor transistor and the second process variation detection component comprises an N-channel metal oxide semiconductor transistor.

10. The process variation detection method applicable to a non-volatile memory as claimed in claim 9, wherein the step of producing the corresponding compensation signal comprises:

using an analog-to-digital converter to convert the current comparison result into the compensation signal.

11. The process variation detection method applicable to a non-volatile memory as claimed in claim 9, wherein the step of producing the compensation signal comprises:

using a latch to latch the compensation signal.

\* \* \* \* \*